US011335710B2

(12) United States Patent
Wang et al.

(10) Patent No.: US 11,335,710 B2
(45) Date of Patent: May 17, 2022

(54) THIN FILM TRANSISTOR, DISPLAY PANEL AND PREPARATION METHOD THEREOF, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Qinghe Wang, Beijing (CN); Tongshang Su, Beijing (CN); Yongchao Huang, Beijing (CN); Yingbin Hu, Beijing (CN); Yang Zhang, Beijing (CN); Haitao Wang, Beijing (CN); Ning Liu, Beijing (CN); Guangyao Li, Beijing (CN); Zheng Wang, Beijing (CN); Yu Ji, Beijing (CN); Jinliang Hu, Beijing (CN); Wei Song, Beijing (CN); Jun Cheng, Beijing (CN); Liangchen Yan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 5 days.

(21) Appl. No.: 16/936,447

(22) Filed: Jul. 23, 2020

(65) Prior Publication Data

US 2021/0225886 A1 Jul. 22, 2021

(30) Foreign Application Priority Data

Jan. 21, 2020 (CN) .......................... 202010070957.9

(51) Int. Cl.
*H01L 27/00* (2006.01)
*H01L 29/00* (2006.01)
(Continued)

(52) U.S. Cl.
CPC ........ *H01L 27/1225* (2013.01); *H01L 27/127* (2013.01); *H01L 27/1262* (2013.01);
(Continued)

(58) Field of Classification Search
CPC ............. H01L 27/1225; H01L 27/1262; H01L 27/127; H01L 29/66969; H01L 29/7869;
(Continued)

(56) References Cited

U.S. PATENT DOCUMENTS 9,324,735 B2* 4/2016 Cheng ................. H01L 27/1259
9,455,343 B2* 9/2016 Pillarisetty ........ H01L 29/66795
(Continued)

OTHER PUBLICATIONS

Krammer et al., "Elevated transition temperature in Ge doped VO2 thin films", 2017, Journal of Applied Physics 122, p. 045304-1-045304-6 (published on Jul. 27, 2017). (Year: 2017).*

*Primary Examiner* — Nikolay K Yushin
(74) *Attorney, Agent, or Firm* — Ling Wu; Stephen Yang; Ling and Yang Intellectual Property

(57) ABSTRACT

A thin film transistor, a display panel and a preparation method thereof and a display apparatus are provided. The thin film transistor includes: a substrate; a gate metal located on a side of the substrate; a gate insulating layer located on a side of the gate metal away from the substrate; an active layer located on a side of the gate insulating layer away from the substrate; a first metal oxide and a second metal oxide which are located on a side of the active layer away from the substrate and are arranged on a same layer; and a source metal and a drain metal which are located on sides of the first metal oxide and the second metal oxide away from the substrate and are arranged in a same layer.

19 Claims, 5 Drawing Sheets

(51) Int. Cl.
*H01L 27/12* (2006.01)
*H01L 29/24* (2006.01)
*H01L 29/66* (2006.01)
*H01L 29/786* (2006.01)

(52) U.S. Cl.
CPC ........ *H01L 29/24* (2013.01); *H01L 29/66969* (2013.01); *H01L 29/7869* (2013.01)

(58) Field of Classification Search
CPC . H01L 29/24; H01L 27/1288; H01L 27/3262; H01L 27/3246; H01L 27/3248; H01L 29/41733; H01L 29/78633
See application file for complete search history.

(56) References Cited

U.S. PATENT DOCUMENTS

| | | | |
|---|---|---|---|
| 2015/0091067 A1* | 4/2015 | Pillarisetty | H01L 45/1616 257/288 |
| 2015/0318311 A1* | 11/2015 | Cheng | H01L 29/42384 257/43 |

* cited by examiner

THIN FILM TRANSISTOR, DISPLAY PANEL AND PREPARATION METHOD THEREOF, AND DISPLAY APPARATUS

CROSS-REFERENCE TO RELATED APPLICATION

The present application claims the priority of Chinese Patent Application No. 202010070957.9 filed to the CNIPA on Tuesday, Jan. 21, 2020, the content of which is hereby incorporated by reference.

TECHNICAL FIELD

The present disclosure relates to, but is not limited to, the technical field of electronic display, and in particular to a thin film transistor, a display panel, and a preparation method thereof and a display apparatus.

BACKGROUND

In the fields of display, light source and electronics, devices all have the problem of high energy consumption. Because a device or product itself is prone to generate heat, the aging rate of the device would be too fast, and its service life would be shortened.

Therefore, reducing the energy consumption of devices and products and prolonging their service life have become one of the mainstream directions in the development of display, light source and electronic products in modern society.

SUMMARY

The following is a summary of the subject matter described in detail in the present disclosure. This summary is not intended to limit the scope of the claims.

The present disclosure provides a thin film transistor, which includes a substrate, a gate metal located on a side of the substrate, and a gate insulating layer located on a side of the gate metal away from the substrate.

The thin film transistor further includes: an active layer located on a side of the gate insulating layer away from the substrate; a first metal oxide and a second metal oxide which are located on a side of the active layer away from the substrate and are arranged on a same layer, wherein the first metal oxide is provided with a first via and the second metal oxide is provided with a second via; and a source metal and a drain metal which are located on sides of the first metal oxide and the second metal oxide away from the substrate and are arranged in a same layer; wherein the source metal is connected with the first metal oxide and is connected with the active layer through the first via; the drain metal is connected with the second metal oxide and is connected with the active layer through the second via; phases of the first metal oxide and the second metal oxide are capable of being changed from an insulation state to a conductive state when temperature rises to a predetermined value.

In an exemplary embodiment, materials of both the first metal oxide and the second metal oxide are vanadium dioxide.

In an exemplary embodiment, the predetermined value is 68 degree centigrade.

In an exemplary embodiment, each of the first metal oxide and the second metal oxide can be doped with a rare metal.

In an exemplary embodiment, the rare metal is germanium.

In an exemplary embodiment, when both the first metal oxide and the second metal oxide are in an insulation state, channel length of the thin film transistor is a distance between a side, close to the second metal oxide, of a part where the first metal oxide contacts the active layer and a side, close to the first metal oxide, of a part where the second metal oxide contacts the active layer.

In an exemplary embodiment, when the phases of the first metal oxide and the second metal oxide are changed to the conductive state, the channel length of the thin film transistor is a distance between an end, close to the second metal oxide, of the first metal oxide and an end, close to the first metal oxide, of the second metal oxide.

In an exemplary embodiment, a material of the gate insulating layer is silicon oxide.

The present disclosure also provides a display panel including any of the above thin film transistors. The display panel further includes: a passivation layer and an organic film layer.

The passivation layer is located on sides of the source metal and the drain metal away from the substrate.

The organic film layer is located on a side of the passivation layer away from the substrate.

In an exemplary embodiment, the display panel further includes: an anode metal layer located on a side of the organic film layer away from the substrate.

The passivation layer is provided with a third via, the organic film layer is provided with a fourth via, the third via communicates with the fourth via, and the anode metal layer is connected with the drain metal through the third via and the fourth via.

In an exemplary embodiment, the display panel further includes: a cathode metal layer located on a side of the anode metal layer away from the substrate; and an emitting layer located between the anode metal layer and the cathode metal layer.

The present disclosure further provides a display apparatus, including any of the above display panels.

The present disclosure also provides a preparation method of a display panel, which includes the following steps: providing a substrate, and sequentially preparing a gate metal, a gate insulating layer, an active layer and a metal oxide layer on the substrate; etching and patterning the metal oxide layer to form a first via and a second via; preparing a source/drain metal layer at a side of the metal oxide layer away from the substrate, and forming a source metal and a drain metal by a patterning process; wherein the source metal is connected with the active layer through the first via, the drain metal is connected with the active layer through the second via, and a part of the metal oxide layer between the first via and the second via is exposed; etching and patterning the exposed part of the metal oxide layer to separate it into a first metal oxide and a second metal oxide; wherein the first via is located in the first metal oxide and the second via is located in the second metal oxide; sequentially preparing a passivation layer, an organic film layer and an anode metal layer at sides of the first metal oxide and the second metal oxide away from the substrate.

In an exemplary embodiment, the passivation layer is provided with a third via, the organic film layer is provided with a fourth via, the third via communicates with the fourth via, and the anode metal layer is connected with the drain metal through the third via and the fourth via.

In an exemplary embodiment, the step of providing the substrate, and sequentially preparing the gate metal, the gate insulating layer, the active layer and the metal oxide layer on the substrate includes: preparing and patterning the gate metal on the substrate by physical vapor deposition, preparing the gate insulating layer by plasma enhanced chemical vapor deposition, preparing the active layer by plasma enhanced chemical vapor deposition, and preparing the metal oxide layer by physical vapor deposition.

In an exemplary embodiment, the step of preparing the passivation layer includes: preparing the passivation layer by physical vapor deposition.

In an exemplary embodiment, the method further includes: sequentially preparing an emitting layer and a cathode metal layer at a side of the anode metal layer away from the substrate; applying a voltage to the gate metal to obtain a display panel capable of emitting light.

In an exemplary embodiment, the step of preparing the source/drain metal layer includes: using metal copper as a material of the source/drain metal layer.

Other features and advantages of the present disclosure will be set forth in the following description, and in part will become apparent from the description, or be learned by practice of the present disclosure. Purposes and advantages of the present disclosure may be realized and obtained by structures specifically pointed out in the specification, claims and drawings.

DETAILED DESCRIPTION

The technical schemes in the embodiments of present disclosure will be described clearly and completely with reference to the drawings in the embodiments of present disclosure. The described embodiments are apparently only part of the embodiments of the present disclosure, rather than all of the embodiments. Based on the embodiments of the present disclosure, all other embodiments obtained by a person of ordinary skill in the art without paying any inventive effort are within the scope of protection of the present application.

It should be understood that the embodiments described below are only used to illustrate and explain the present disclosure, and are not used to limit the present disclosure. Moreover, without a conflict, the embodiments in the present disclosure and features in the embodiments may be combined with each other.

Figure 1:
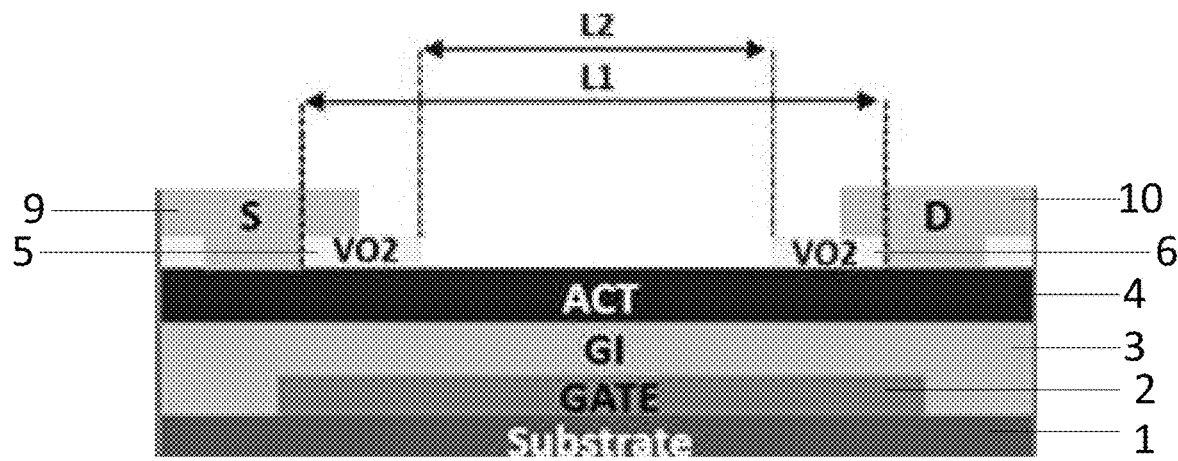
FIG. 1 is a schematic structural diagram of a thin film transistor according to an embodiment of the present disclosure.

FIG. 1 is a schematic structural diagram of a thin film transistor according to an embodiment of the present disclosure. As shown in FIG. 1, the thin film transistor according to an embodiment of the present disclosure includes a substrate 1, a gate metal 2 located on a side of the substrate 1, and a gate insulating layer 3 located on a side of the gate metal 2 away from the substrate 1. The thin film transistor further includes an active layer 4, a first metal oxide 5, a second metal oxide 6, a source metal 9 and a drain metal 10. The active layer 4 is located on a side of the gate insulating layer 3 away from the substrate 1. The first metal oxide 5 and the second metal oxide 6 are located on a side of the active layer 4 away from the substrate 1 and are arranged on a same layer. The first metal oxide 5 is provided with a first via 7 and the second metal oxide 6 is provided with a second via 8. The source metal 9 and the drain metal 10 are located on sides of the first metal oxide 5 and the second metal oxide 6 away from the substrate 1 and are arranged in a same layer. The source metal 9 is connected with the first metal oxide 5 and is connected with the active layer 4 through the first via 7. The drain metal 10 is connected with the second metal oxide 6 and is connected with the active layer 4 through the second via 8. Phases of the first metal oxide 5 and the second metal oxide 6 are capable of being changed from an insulation state to a conductive state when temperature rises to a predetermined value.

In the thin film transistor according to an embodiment of the present disclosure, when the temperature of the thin film transistor is less than a predetermined value, both the first metal oxide 5 and the second metal oxide 6 are in an insulation state, and in this case, channel length of the thin film transistor is a distance between a side, close to the second metal oxide 6, of a part where the first metal oxide 5 contacts the active layer 4 and a side, close to the first metal oxide 5, of a part where the second metal oxide 6 contacts the active layer 4 (i.e., L1 shown in FIG. 1). In operation, a relatively high voltage is applied to the gate until the temperature of the thin film transistor rises to a predetermined value, and both the first metal oxide 5 and the second metal oxide 6 undergo lattice phase change from an insulation state to a conductive state. In this case, the source metal 9 and the first metal oxide 5 together constitute the source structure of the thin film transistor, and the drain metal 10 and the second metal oxide 6 together constitute the drain structure of the thin film transistor. Therefore, in this case, the channel length of the thin film transistor is a distance between an end, close to the second metal oxide 6, of the first metal oxide 5 and an end, close to the first metal oxide 5, of the second metal oxide 6 (i.e., L2 shown in FIG. 1, which is less than L1). Then, a relatively small voltage is applied to the gate to make the thin film transistor to reach the response brightness of the light source or display before the phase change occurs.

In this arrangement, when the temperature rises to a predetermined value, the phases of the first metal oxide 5 and the second metal oxide 6 are both changed from the insulation state to the conductive state, and the parts, corresponding to the trace region of the thin film transistor, of the bottom of the source/drain metal layer are all provided with the first metal oxide 5 and the second metal oxide 6. Therefore, the channel length of the thin film transistor is reduced, the whole resistance of the source/drain electrode layer is reduced, and the current flowing out of the drain terminal is increased, thereby the performance of the thin film transistor is improved. In addition, the first metal and the second metal will absorb the heat generated by the high voltage applied to the gate during the phase change process, and the generated useless heat is reused. Furthermore, a relatively small voltage is applied to the gate electrode finally, and the thin film transistor will still return to the response brightness of the light source or display before the phase change occurs. In this case, the current load of the line is reduced. Therefore, the service life of the thin film transistor is improved, and energy is saved.

In an exemplary embodiment, materials of both the first metal oxide 5 and the second metal oxide 6 are vanadium dioxide. The predetermined value is 68 degree centigrade.

Each of the first metal oxide 5 and the second metal oxide 6 can be doped with a rare metal.

In the current embodiment, the rare metal can be germanium. Germanium can be used to adjust the phase change temperature of vanadium dioxide, which is convenient for adjusting the temperature required for the phase change of the first metal oxide 5 and the second metal oxide 6 under different environmental temperatures, and improves the operating efficiency.

To sum up, the present disclosure provides a thin film transistor, which includes a substrate, a gate metal located on a side of the substrate, and a gate insulating layer located on a side of the gate metal away from the substrate. The thin film transistor further includes an active layer, a first metal oxide, a second metal oxide, a source metal and a drain metal. The active layer is located on a side of the gate insulating layer away from the substrate. The first metal oxide and the second metal oxide are located on a side of the active layer away from the substrate and are arranged on a same layer. The first metal oxide is provided with a first via and the second metal oxide is provided with a second via. The source metal and the drain metal are located on sides of the first metal oxide and the second metal oxide away from the substrate and are arranged in a same layer. The source metal is connected with the first metal oxide and is connected with the active layer through the first via. The drain metal is connected with the second metal oxide and is connected with the active layer through the second via. Phases of the first metal oxide and the second metal oxide are capable of being changed from an insulation state to a conductive state when temperature rises to a predetermined value.

In the thin film transistor according to the present disclosure, when the temperature of the thin film transistor is less than a predetermined value, both the first metal oxide and the second metal oxide are in an insulation state, in this case, the channel length of the thin film transistor is a distance between a side, close to the second metal oxide, of a part where the first metal oxide contacts the active layer and a side, close to the first metal oxide, of a part where the second metal oxide contacts the active layer. In operation, a relatively high voltage is applied to the gate until the temperature of the thin film transistor rises to a predetermined value, and both the first metal oxide and the second metal oxide undergo lattice phase change from an insulation state to a conductive state. In this case, the source metal and the first metal oxide together constitute the source structure of the thin film transistor, and the drain metal and the second metal oxide together constitute the drain structure of the thin film transistor. Therefore, in this case, the channel length of the thin film transistor is a distance between an end, close to the second metal oxide, of the first metal oxide and an end, close to the first metal oxide, of the second metal oxide. Then, a relatively small voltage is applied to the gate to make the thin film transistor to reach the response brightness of the light source or display before the phase change occurs.

In this arrangement, when the temperature rises to a predetermined value, the phases of the first metal oxide and the second metal oxide are both changed from the insulation state to the conductive state, and the parts, corresponding to the trace region of the thin film transistor, of the bottom of the source/drain metal layer are all provided with the first metal oxide and the second metal oxide. Therefore, the channel length of the thin film transistor is reduced, the whole resistance of the source/drain electrode layer is reduced, and the current flowing out of the drain terminal is increased, thereby the performance of the thin film transistor is improved. In addition, the first metal and the second metal will absorb the heat generated by the high voltage applied to the gate during the phase change process, and the generated useless heat is reused. Furthermore, a relatively small voltage is applied to the gate electrode finally, and the thin film transistor will still return to the response brightness of the light source or display before the phase change occurs. In this case, the current load of the line is reduced. Therefore, the service life of the thin film transistor is improved, and energy is saved.

Figure 2:
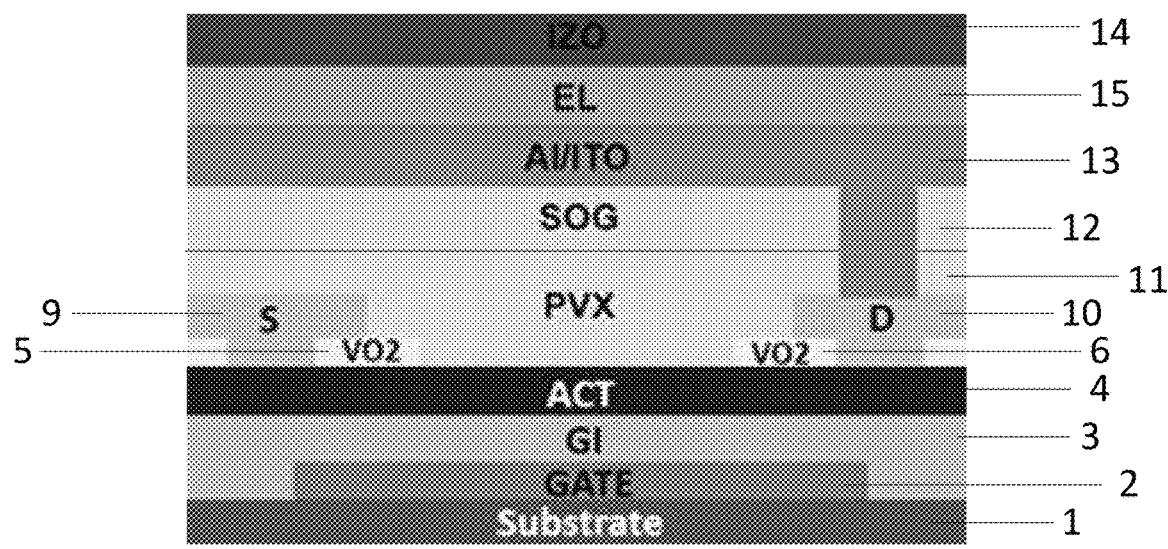
FIG. 2 is a schematic structural diagram of a display panel according to an embodiment of the present disclosure.

FIG. 2 is a schematic structural diagram of a display panel according to an embodiment of the present disclosure. As shown in FIG. 2, an embodiment of the present disclosure further provides a display panel including any of the above thin film transistors. The display panel further includes: a passivation layer 11 and an organic film layer 12. The passivation layer 11 is located on sides of the source metal 9 and the drain metal 10 away from the substrate 1. The organic film layer 12 is located on a side of the passivation layer 11 away from the substrate 1.

As shown in FIG. 2, the display panel further includes an anode metal layer 13 located on a side of the organic film layer 12 away from the substrate 1. The passivation layer 11 is provided with a third via, the organic film layer 12 is provided with a fourth via, the third via communicates with the fourth via, and the anode metal layer 13 is connected with the drain metal 10 through the third via and the fourth via.

As shown in FIG. 2, the display panel further includes: a cathode metal layer 14 and an emitting layer 15. The cathode metal layer 14 is located on a side of the anode metal layer 13 away from the substrate 1. The emitting layer 15 is located between the anode metal layer 13 and the cathode metal layer 14.

An embodiment of the present disclosure further provides a display apparatus, including any one of the above display panels.

Figure 3:
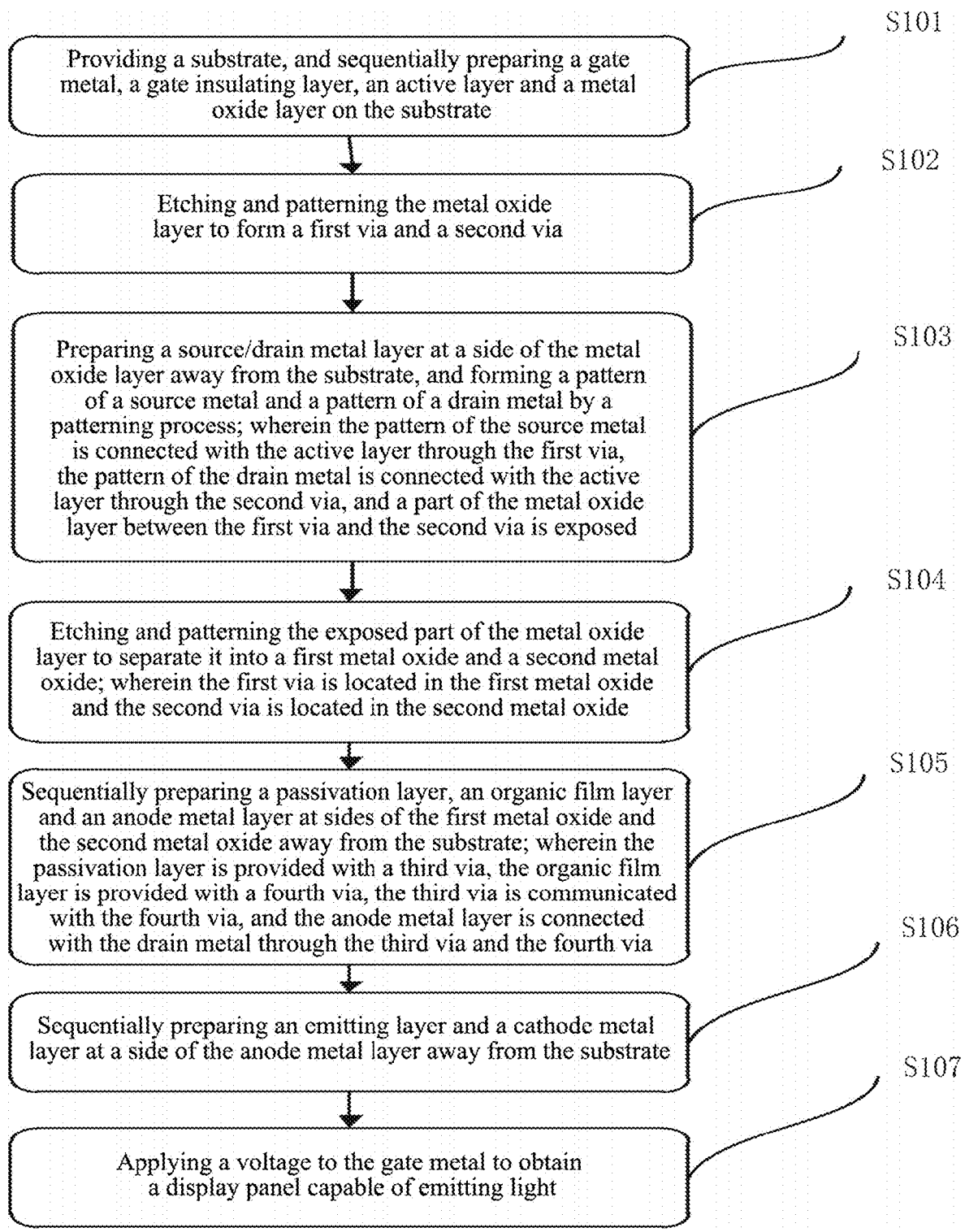
FIG. 3 is a flowchart of a preparation method of a display panel according to an embodiment of the present disclosure.

FIG. 3 is a flowchart of a preparation method of a display panel according to an embodiment of the present disclosure, and FIGS. 4-10 are schematic structural diagrams of various steps corresponding to a preparation method of a display panel according to an embodiment of the present disclosure. As shown in FIGS. 3-10, an embodiment of the present disclosure further provides a preparation method applied to any above display panel. The preparation method includes the following steps: S101, S102, S103, S104, S105, S106, S107.

Figure 4:
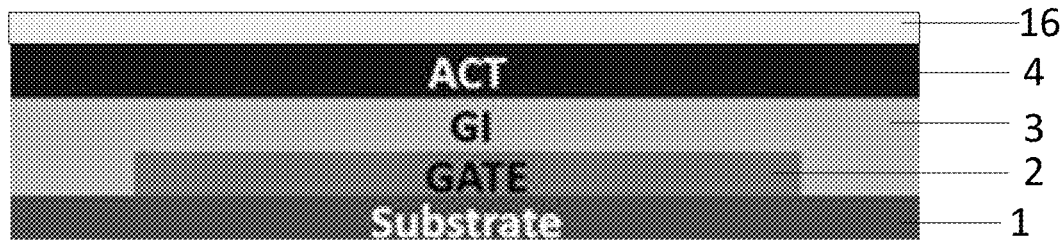
FIGS. 4-10 are schematic structural diagrams of various steps corresponding to a preparation method of a display panel according to an embodiment of the present disclosure.

As shown in FIGS. 3 and 4, in step S101, a substrate 1 is provided, and a gate metal 2, a gate insulating layer 3, an active layer 4 and a metal oxide layer 16 are prepared sequentially on the substrate 1. The gate metal 2 can be prepared and patterned on the substrate 1 by physical vapor deposition; the gate insulating layer 3 can be prepared by plasma enhanced chemical vapor deposition, the material of the gate insulating layer 3 can be silicon oxide; the active layer 4 can be prepared by plasma enhanced chemical vapor deposition; and the metal oxide layer 16 can be prepared by physical vapor deposition.

Figure 5:
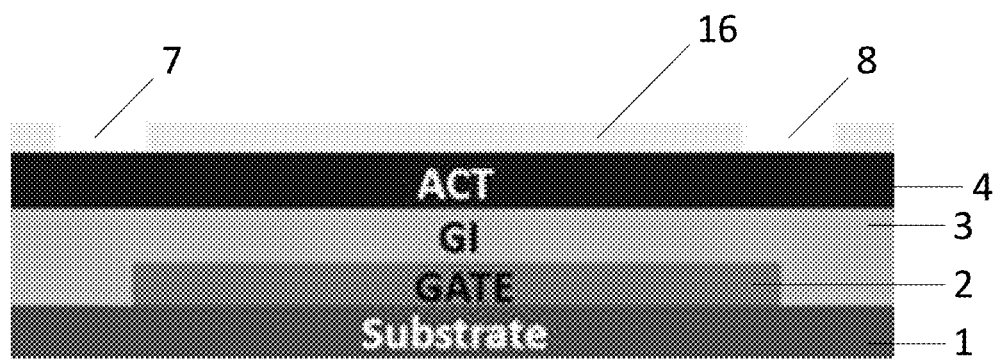

As shown in FIGS. 3 and 5, in step S102, the metal oxide layer 16 is etched and patterned to form a first via 7 and a second via 8.

Figure 6:
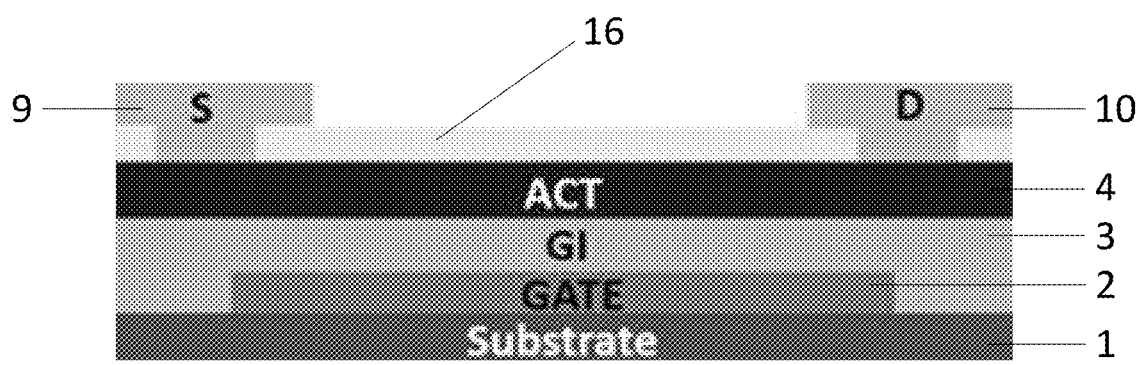

As shown in FIGS. 3 and 6, in step S103, a source/drain metal layer is prepared at a side of the metal oxide layer 16 away from the substrate 1, and a pattern of a source metal 9 and a pattern of a drain metal 10 are formed by a patterning process. The pattern of the source metal 9 is connected with the active layer 4 through the first via 7, the pattern of the drain metal 10 is connected with the active layer 4 through the second via 8, and a part of the metal oxide layer 16 between the first via 7 and the second via 8 is exposed. The material of the source/drain metal layer can be metal copper.

Figure 7:
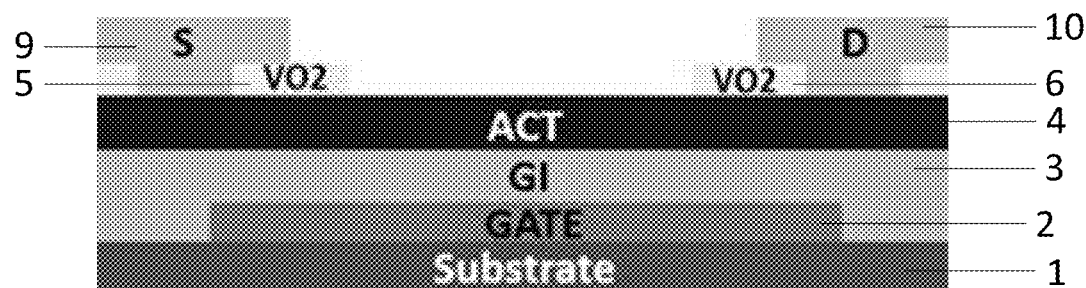

As shown in FIGS. 3 and 7, in step S104, the exposed part of the metal oxide layer 16 is etched and patterned to separate it into a first metal oxide 5 and a second metal oxide 6. The first via 7 is located in the first metal oxide 5 and the second via 8 is located in the second metal oxide 6.

Figure 8:
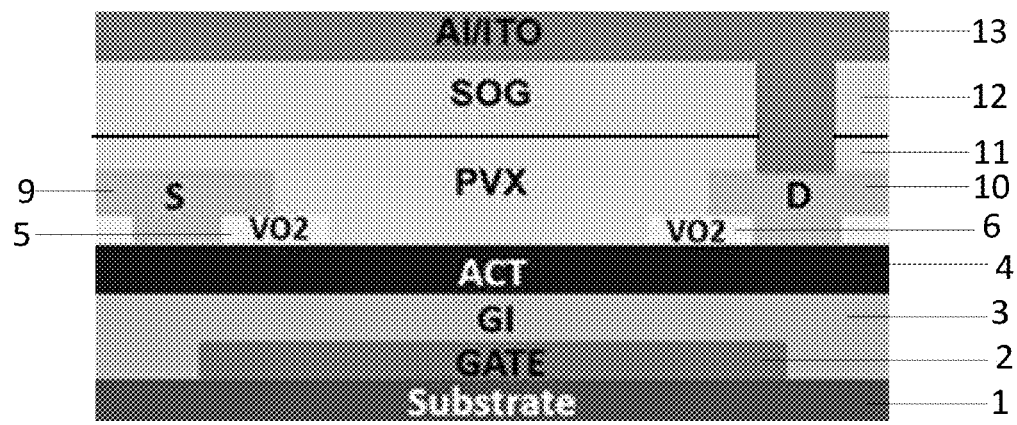

As shown in FIGS. 3 and 8, in step S105, a passivation layer 11, an organic film layer 12 and an anode metal layer 13 are prepared sequentially at sides of the first metal oxide 5 and the second metal oxide 6 away from the substrate 1. The passivation layer 11 is provided with a third via, the organic film layer 12 is provided with a fourth via, the third via communicates with the fourth via, and the anode metal layer 13 is connected with the drain metal 10 through the third via and the fourth via. The passivation layer 11 can be prepared by physical vapor deposition.

Figure 9:
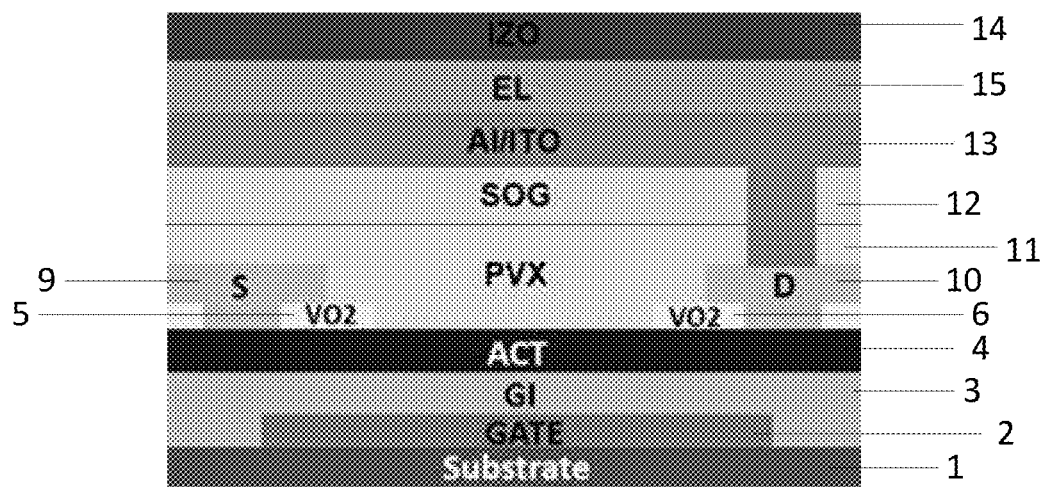

As shown in FIGS. 3 and 9, in step S106, an emitting layer 15 and a cathode metal layer 14 are prepared sequentially at a side of the anode metal layer 13 away from the substrate 1. The emitting layer 15 can be evaporated by evaporation equipment, and the cathode metal layer 14 can be prepared by sputtering.

Figure 10:
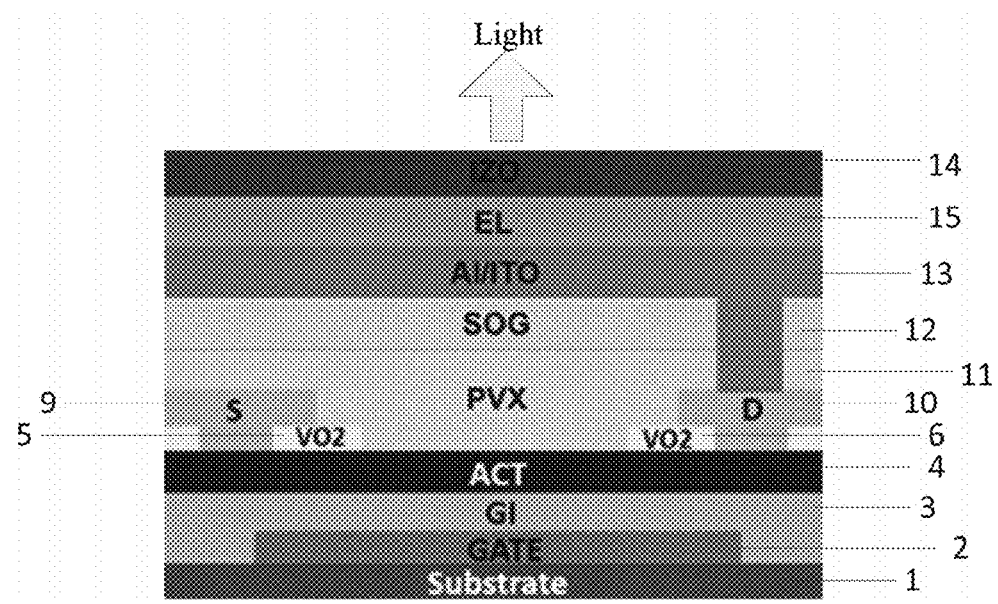

As shown in FIGS. 3 and 10, in step S107, a voltage is applied to the gate metal 2 to obtain a display panel capable of emitting light.

Apparently, those skilled in the art can make various modifications and variations to the application without departing from the spirit and scope of the application. Thus, if these modifications and variations to the present application fall within the scope of the claims of the present application and their equivalent techniques, the present application is intended to include these modifications and variations.

What we claim is:

1. A display panel comprising a thin film transistor, wherein the thin film transistor comprises a substrate, a gate metal located on a side of the substrate, and a gate insulating layer located on a side of the gate metal away from the substrate, wherein the thin film transistor further comprises:
    an active layer located on a side of the gate insulating layer away from the substrate;
    a first metal oxide and a second metal oxide which are located on a side of the active layer away from the substrate and are arranged on a same layer, wherein the first metal oxide is provided with a first via and the second metal oxide is provided with a second via; and
    a source metal and a drain metal which are located on sides of the first metal oxide and the second metal oxide away from the substrate and are arranged in a same layer; wherein the source metal is connected with the first metal oxide and is connected with the active layer through the first via; the drain metal is connected with the second metal oxide and is connected with the active layer through the second via; phases of the first metal oxide and the second metal oxide are capable of being changed from an insulation state to a conductive state when temperature rises to a predetermined value;
    wherein the display panel further comprises:
    a passivation layer located on sides of the source metal and the drain metal away from the substrate; and
    an organic film layer located on a side of the passivation layer away from the substrate.

2. The display panel according to claim 1, wherein when both the first metal oxide and the second metal oxide are in an insulation state, channel length of the thin film transistor is a distance between a side, close to the second metal oxide, of a part where the first metal oxide contacts the active layer and a side, close to the first metal oxide, of a part where the second metal oxide contacts the active layer.

3. The display panel according to claim 1, wherein when the phases of the first metal oxide and the second metal oxide are changed to the conductive state, the channel length of the thin film transistor is a distance between an end, close to the second metal oxide, of the first metal oxide and an end, close to the first metal oxide, of the second metal oxide.

4. The display panel according to claim 1, wherein a material of the gate insulating layer is silicon oxide.

5. A display apparatus, comprising the display panel according to claim 1.

6. The display panel according to claim 1, wherein materials of both the first metal oxide and the second metal oxide are vanadium dioxide.

7. The display panel according to claim 6, wherein the predetermined value is 68 degree centigrade.

8. The display panel according to claim 7, wherein each of the first metal oxide and the second metal oxide can be doped with a rare metal.

9. The display panel according to claim 8, wherein the rare metal is germanium.

10. The display panel according to claim 1, further comprising: an anode metal layer located on a side of the organic film layer away from the substrate; wherein
    the passivation layer is provided with a third via, the organic film layer is provided with a fourth via, the third via communicates with the fourth via, and the anode metal layer is connected with the drain metal through the third via and the fourth via.

11. A display apparatus, comprising the display panel according to claim 10.

12. The display panel according to claim 10, further comprising:
    a cathode metal layer located on a side of the anode metal layer away from the substrate; and
    an emitting layer located between the anode metal layer and the cathode metal layer.

13. A display apparatus, comprising the display panel according to claim 12.

14. A preparation method of a display panel, comprising the following steps:
    providing a substrate, and sequentially preparing a gate metal, a gate insulating layer, an active layer and a metal oxide layer on the substrate;
    etching and patterning the metal oxide layer to form a first via and a second via;
    preparing a source/drain metal layer at a side of the metal oxide layer away from the substrate, and forming a source metal and a drain metal by a patterning process; wherein the source metal is connected with the active layer through the first via, the drain metal is connected with the active layer through the second via, and a part of the metal oxide layer between the first via and the second via is exposed;
    etching and patterning the exposed part of the metal oxide layer to separate it into a first metal oxide and a second metal oxide; wherein the first via is located in the first metal oxide and the second via is located in the second metal oxide; and
    sequentially preparing a passivation layer, an organic film layer and an anode metal layer at sides of the first metal oxide and the second metal oxide away from the substrate.

15. The preparation method according to claim 14, wherein the passivation layer is provided with a third via, the organic film layer is provided with a fourth via, the third via communicates with the fourth via, and the anode metal layer is connected with the drain metal through the third via and the fourth via.

16. The preparation method according to claim 14, wherein the step of providing the substrate, and sequentially preparing the gate metal, the gate insulating layer, the active layer and the metal oxide layer on the substrate comprises:
   preparing and patterning the gate metal on the substrate by physical vapor deposition, preparing the gate insulating layer by plasma enhanced chemical vapor deposition, preparing the active layer by plasma enhanced chemical vapor deposition, and preparing the metal oxide layer by physical vapor deposition.

17. The preparation method according to claim 15, wherein the step of preparing the passivation layer comprises:
   preparing the passivation layer by physical vapor deposition.

18. The preparation method according to claim 15, further comprising:
   sequentially preparing an emitting layer and a cathode metal layer at a side of the anode metal layer away from the substrate; and
   applying a voltage to the gate metal to obtain a display panel capable of emitting light.

19. The preparation method according to claim 14, wherein the step of preparing the source/drain metal layer comprises:
   using metal copper as a material of the source/drain metal layer.

\* \* \* \* \*